(12) United States Patent
Higuchi et al.

(10) Patent No.: US 9,128,375 B2
(45) Date of Patent: Sep. 8, 2015

(54) RESIN COMPOSITION FOR MASKS

(75) Inventors: Michiya Higuchi, Nagaokakyo (JP); Fumito Suzuki, Moriyama (JP); Yoshio Sakai, Otsu (JP); Hisashi Marusawa, Joyo (JP)

(73) Assignee: GOO CHEMICAL CO., LTD., Kyoto (JP)

( * ) Notice: Subject to any disclaimer, the term of this patent is extended or adjusted under 35 U.S.C. 154(b) by 0 days.

(21) Appl. No.: 14/237,962

(22) PCT Filed: Jun. 20, 2012

(86) PCT No.: PCT/JP2012/065784
§ 371 (c)(1),
(2), (4) Date: Feb. 10, 2014

(87) PCT Pub. No.: WO2013/021734
PCT Pub. Date: Feb. 14, 2013

(65) Prior Publication Data
US 2014/0186766 A1    Jul. 3, 2014

(30) Foreign Application Priority Data
Aug. 11, 2011  (JP) ................................. 2011-176231

(51) Int. Cl.
| | | |
|---|---|---|
| G03F 7/038 | (2006.01) | |
| C08G 59/40 | (2006.01) | |
| G03F 7/027 | (2006.01) | |
| H05K 3/28 | (2006.01) | |
| C08G 59/17 | (2006.01) | |
| C08G 59/42 | (2006.01) | |
| C08L 63/10 | (2006.01) | |
| G03F 7/032 | (2006.01) | |
| H05K 3/34 | (2006.01) | |

(52) U.S. Cl.
CPC .......... *G03F 7/0385* (2013.01); *C08G 59/1466* (2013.01); *C08G 59/40* (2013.01); *C08G 59/42* (2013.01); *C08L 63/10* (2013.01); *G03F 7/027* (2013.01); *G03F 7/032* (2013.01); *G03F 7/038* (2013.01); *G03F 7/0384* (2013.01); *G03F 7/0388* (2013.01); *H05K 3/287* (2013.01); *H05K 3/3452* (2013.01)

(58) Field of Classification Search
None
See application file for complete search history.

(56) References Cited

U.S. PATENT DOCUMENTS

| | | | | |
|---|---|---|---|---|
| 3,700,643 | A * | 10/1972 | Smith et al. ................... | 526/282 |
| 4,525,258 | A * | 6/1985 | Watanabe et al. ............... | 522/14 |
| 5,364,736 | A * | 11/1994 | Eramo et al. ............... | 430/280.1 |
| 2002/0136986 | A1 | 9/2002 | Chang et al. | |
| 2004/0067440 | A1* | 4/2004 | Minegishi et al. ......... | 430/280.1 |
| 2011/0082229 | A1* | 4/2011 | Ikegami et al. ................. | 522/68 |

FOREIGN PATENT DOCUMENTS

| | | |
|---|---|---|
| JP | 10-274849 A | 10/1998 |
| JP | 2000-109541 A | 4/2000 |
| JP | 2001-324805 A | 11/2001 |
| JP | 2002-187934 A | 7/2002 |
| JP | 2004-45792 A | 2/2004 |
| JP | 2007-176987 A | 7/2007 |
| JP | 2008-116813 A | 5/2008 |
| JP | 2010-78949 A | 4/2010 |
| WO | WO-01/24774 A1 | 4/2001 |
| WO | WO-03/059975 A1 | 7/2003 |

OTHER PUBLICATIONS

English translation of WO 03/059975 A1 generated on Jul. 3, 2014 from from machine translation from AIPN Japan Patent Office National Center for Industrial Property Information and Training, 13 pages.*
International Search Report for the Application No. PCT/JP2012/065784 mailed Sep. 25, 2012.
Supplementary European Search Report for the Application No. EP 12 82 1497 dated Feb. 25, 2015.
Hata, Naoaki, "Add Anhydride Cured Epoxy Resin", Thermocurable Resin, 1981, vol. 2, No. 1, pp. 29-37.

\* cited by examiner

*Primary Examiner* — Cynthia Hamilton
(74) *Attorney, Agent, or Firm* — Cheng Law Group, PLLC

(57) ABSTRACT

The present invention provides a resin composition for resist to be efficiently formed into a cured product with high properties of crack resistance, bulge resistance, protrusion resistance, and the like for filling a through-hole, a via hole, or the like with the cured product. The resin composition for masks in accordance with the present invention contains a first resin and a second resin. The first resin is prepared by an addition reaction of polybasic acid anhydride with an adduct of an ethylenically unsaturated compound having a carboxyl group and bifunctional epoxy resin. The second resin having; a group obtained by an addition reaction of an epoxy group with monocarboxylic acid; and a group obtained by addition reaction of an epoxy group with polybasic acid.

8 Claims, No Drawings

RESIN COMPOSITION FOR MASKS

TECHNICAL FIELD

The present invention relates to a resin composition to be applied on a printed wiring board to form a mask.

BACKGROUND ART

It is common to form a solder mask of a resin composition for masks on a printed wiring board. Furthermore, when a printed wiring board having a through-hole or a via hole is used, the through-hole or the like is often filled with the resin composition for masks, in order to suppress deterioration in appearance of the resultant product due to a solder adhering to a periphery of the through-hole or the like, or due to a flux extending to a back side of the printed wiring board through the through-hole or the like.

When the resin composition for masks is used as described above, particularly when the resin composition for masks is used for filling the through-hole or the like, required are properties such as a property (crack resistance) that a crack is less likely to occur in a cured product of the resin composition in a process of post cure or solder leveling, a property (bulge resistance) that a bulge on the cured product and peeling due to the bulge are less likely to occur in a process of solder-leveling, and a property (protrusion resistance) that the cured product is less likely to protrude from the through-hole or the like in a process of post cure or solder leveling.

Conventionally, Patent Literature 1, for example, proposes, as an example of the resin composition for masks used for filling holes, a photosensitive resin composition capable of being developed by alkaline developers, the photosensitive resin composition containing: photosensitive resin having a carboxyl group obtained by reacting polybasic acid anhydride with a product of a reaction of an epoxy compound having a particular structure including epoxy groups at both ends with monocarboxylic acid having an unsaturated group; copolymer resin having a carboxyl group obtained by reacting (meth)acryl-based copolymer resin having a carboxyl group with a compound having both of an oxysilanyl ring and an ethylenically unsaturated group per molecule; a photopolymerization initiator; a reactive diluent; and a compound having an epoxy group. A through-hole or the like is filled with the photosensitive resin composition described in Patent Literature 1, and the photosensitive resin composition by means of irradiating it with activated energy rays and thereafter the photosensitive resin composition is subjected to two-stage or three-stage heating. Consequently, the through-hole or the like is filled.

However, techniques described in Patent Literature 1 require two-stage or three-stage heating for filling holes as described above, and have a problem of poor processing efficiency. In contrast, when only one-stage heating is performed in order to improve processing efficiency, thus-obtained cured product for filling the through-hole or the like has insufficient properties of the crack resistance, the bulge resistance, the protrusion resistance, and the like.

CITATION LIST

Patent Literature

Patent Literature 1: JP2008-116813 A

SUMMARY OF INVENTION

Technical Problem

The present invention has been made in view of the above insufficiency, and an object thereof is to provide a resin composition for masks which allows efficient formation of a cured product having high properties of the crack resistance, the bulge resistance, the protrusion resistance, and the like, in a process of filling a through-hole, a via hole, or the like with the cured product of the resin composition for masks.

Solution to Problem

According to a first aspect of the present invention, there is provided a resin composition for masks, containing: a first resin prepared by an addition reaction of polybasic acid anhydride with an adduct of an ethylenically unsaturated compound having a carboxyl group and bifunctional epoxy resin; and a second resin having a group obtained by an addition reaction of an epoxy group with monocarboxylic acid and further a group obtained by addition reaction of an epoxy group with polybasic acid.

In other words, according to the first aspect of the preset invention, there is provided the resin composition for masks, containing: the first resin having a structure obtained by addition reaction of polybasic acid anhydride with an adduct of an ethylenically unsaturated compound having a carboxyl group and bifunctional epoxy resin; and the second resin having a structure prepared by an addition reaction of the monocarboxylic acid with one of epoxy groups of polyfunctional epoxy resin and an addition reaction of the polybasic acid with another of the epoxy groups.

According to a second aspect of the present invention, there is provided a resin composition for masks used for filling a hole in a printed wiring board, the resin composition being in accordance with the first aspect.

According to a third aspect of the present invention, there is provided a resin composition for masks further containing an epoxy compound having at least two epoxy groups per molecule, the resin composition being in accordance with the first or second aspect.

According to a fourth aspect of the present invention, there is provided a resin composition for masks wherein the epoxy compound containing liquid bifunctional epoxy resin, the resin composition being in accordance with the third aspect.

According to a fifth aspect of the present invention, there is provided a resin composition for masks further containing a photopolymerization initiator, the resin composition being in accordance with any one of the first to the fourth aspects.

According to a sixth aspect of the present invention, there is provided a resin composition for masks containing a photopolymerizable compound that contains at least one selected from a group consisting of monomer and prepolymer both having photopolymerization properties, the resin composition being in accordance with any one of the first to the fifth aspects.

According to a seventh aspect of the present invention, there is provided a resin composition for masks wherein the ethylenically unsaturated compound of the first resin contains ω-carboxy-polycaprolactone monoacrylate represented by the following general formula (I):

$$H_2C=CHCOO(C_5H_{10}COO)_nH \tag{1}$$

wherein n is an integer of 1 or more, the resin composition being in accordance with any one of the first to the sixth aspects.

According to an eighth aspect of the present invention, there is provided a resin composition wherein the ethylenically unsaturated compound of the first resin further contains acrylic acid, the resin composition being in accordance with any one of the first to the seventh aspects.

According to a ninth aspect of the present invention, there is provided a resin composition for masks wherein the monocarboxylic acid of the second resin contains monocarboxylic acid containing an ethylenically unsaturated group, the resin composition being in accordance with any one of the first to the eighth aspects.

According to a tenth aspect of the present invention, there is provided a resin composition for masks wherein the polyfunctional epoxy resin of the second resin is novolac epoxy resin, the resin composition being in accordance with any one of the first to the ninth aspects.

Namely, according to the tenth aspect of the present invention, there is provided the resin composition for masks wherein: the second resin is prepared by an addition reaction of the monocarboxylic acid with one of epoxy groups of polyfunctional epoxy resin and an addition reaction of the polybasic acid with another of the epoxy groups; and the polyfunctional epoxy resin is novolac epoxy resin, the resin composition being in accordance with any one of the first to the ninth aspects.

SUMMARY OF INVENTION

According to the present invention, there is provided a resin composition for masks which allows efficient formation of a cured product having high properties of the crack resistance, the bulge resistance, the protrusion resistance, and the like, in a process of filling a through-hole, a via hole, or the like with the cured product of the resin composition.

DESCRIPTION OF EMBODIMENTS

Components of Resin Composition for Masks

Components contained in a resin composition for masks in accordance with the present embodiment will be described.
(1) Resin Having a Carboxylic Group
 a. First Resin A first resin is prepared by an addition reaction of polybasic acid anhydride with an adduct of an ethylenically unsaturated compound having a carboxyl group and bifunctional epoxy resin. Namely, the first resin has a structure obtained by the addition reaction of the polybasic acid anhydride with the adduct of the ethylenically unsaturated compound having a carboxyl group and epoxy resin. In this regard, the epoxy resin is bifunctional epoxy resin. Furthermore, the ethylenically unsaturated compound preferably contains ω-carboxy-polycaprolactone monoacrylate represented by the following general formula (I):

$$H_2C=CHCOO(C_5H_{10}COO)_nH \qquad (1)$$

wherein n is an integer of 1 or more.

The first resin is, for example, prepared by reacting an ethylenically unsaturated compound with an epoxy resin by means of an addition reaction and further reacting acid anhydride addition with thus-obtained adduct by means of an addition reaction.

The addition reaction between the epoxy resin and the ethylenically unsaturated compound having a carboxyl group is a ring-opening addition reaction involving an epoxy group of the epoxy resin and a carboxyl group of the ethylenically unsaturated compound having the carboxyl group. Consequently, the product (adduct) generated in the addition reaction has a hydroxyl group.

The addition reaction between the adduct and the polybasic acid anhydride is an esterification reaction involving an acid anhydride group of the polybasic acid anhydride and the hydroxyl group generated in the ring-opening reaction, or an esterification reaction involving the acid anhydride group of the polybasic acid anhydride and a hydroxyl group that the epoxy resin originally has. Consequently, the first resin has a carboxyl group.

The first resin is produced by the aforementioned reactions, and therefore has: an ethylenically unsaturated bonding derived from the ethylenically unsaturated compound having a carboxyl group; and the carboxyl group derived from the polybasic acid anhydride.

Furthermore, when the epoxy resin used for synthesis of the first resin is bifunctional epoxy resin while the ethylenically unsaturated compound having a carboxyl group particularly contains ω-carboxy-polycaprolactone monoacrylate, a cured product made of the resin composition for masks containing this first resin has highly increased flexibility, and cure shrinkage in curing the resin composition for masks is reduced. Therefore, a crack is less likely to occur in the cured product. Moreover, the cured product of the resin composition for masks is likely to have high heat-resistance since a cured product of the first resin having such a structure has high heat-resistance.

The epoxy resin, the ethylenically unsaturated compound having a carboxyl group, and the acid anhydride used for synthesis of the first resin will be more specifically described.

Examples of the epoxy resin for synthesis of the first resin include bisphenol A epoxy resin (e.g., jER1001 (trade name) available from Mitsubishi Chemical Corporation), bisphenol F epoxy resin (e.g., jER4004P (trade name) available from Mitsubishi Chemical Corporation), bisphenol S epoxy resin (e.g., EPICLON EXA-1514 (trade name) available from DIC Corporation), bisphenol AD epoxy resin, biphenyl-type epoxy resin (e.g., YX7399 (trade name) available from Mitsubishi Chemical Corporation), hydrogenated bisphenol A epoxy resin (e.g., ST-4000D (trade name) available from NIPPON STEEL CHEMICAL CO., LTD.), specialized bifunctional epoxy resin (e.g., YL7175-500 and YL7175-1000 available from Mitsubishi Chemical Corporation, and EPICLON TSR-960, EPICLON TER-601, EPICLON TSR-250-80BX, EPICLON 1650-75 MPX, EPICLON EXA-4850, EPICLON EXA-4816, EPICLON EXA-4822, and EPICLON EXA-9726 available from DIC Corporation, and YSLV-120TE (all trade names) available from NIPPON STEEL CHEMICAL CO., LTD.), and bisphenol-type epoxy resin other than the above examples.

In view of imparting good photosensitivity to the resin composition for masks and improving the flexibility of the cured product sufficiently, the epoxy equivalent weight of the epoxy resin preferably falls within a range of 170 to 5000. The epoxy equivalent weight more preferably falls within a range of 170 to 3300, much more preferably falls within a range of 170 to 2200, and most preferably falls within a range of 170 to 1000.

The ethylenically unsaturated compound having a carboxyl group used for synthesis of the first resin preferably contains ω-carboxy-polycaprolactone monoacrylate, as described above. The number average molecular weight of the ω-carboxy-polycaprolactone monoacrylate is not particularly limited, but is preferably 200 or more, and much more preferably 250 or more. Furthermore, the number average molecular weight is preferably 400 or less, and is more preferably 350 or less.

Note that the number average molecular weight is measured by means of gel permeation chromatography under the following conditions.

GPC apparatus: SHODEX SYSTEM 11 available from SHOWA DENKO K.K.
Column: SHODEX KF-800P, KF-005, KF-003, and KF-001, the four being connected in series.
Mobile phase: THF
Flow rate: 1 mL/min
Column temperature: 45° C.
Detector: RI
Polystyrene equivalent Using ω-carboxy-polycaprolactone monoacrylate makes it possible to improve the crack resistance and the bulge resistance of the cured product formed of the resin composition for masks. This may be because ω-carboxy-polycaprolactone monoacrylate provides a cross-linked structure to a resin skeleton of the cured product formed of the resin composition for masks, and the cross-linked structure is effective to an improvement on the abovementioned properties.

A ratio of the amount of the ω-carboxy-polycaprolactone monoacrylate to the total amount of the ethylenically unsaturated compound having a carboxyl group preferably falls within a range of 20 to 100 mol %, and preferably falls within a range of 35 to 100 mol %, in particular.

When the ethylenically unsaturated compound having a carboxyl group further contains a compound in addition to ω-carboxy-polycaprolactone monoacrylate, the compound may be selected from appropriate polymer or prepolymer. Examples of the compound include: a compound having one ethylenically unsaturated group such as acrylic acid, methacrylic acid, crotonic acid, cinnamic acid, 2-acryloyloxyethyl succinic acid, 2-methacryloyloxyethyl succinic acid, 2-acryloyloxyethyl phthalic acid, 2-methacryloyloxyethyl phthalic acid, β-carboxyethyl acrylate, acryloyloxyethyl succinate, methacryloyloxyethyl succinate, 2-propenoic acid, 3-(2-carboxyethoxy)-3-oxypropyl ester, 2-acryloyloxyethyl tetrahydrophthalic acid, 2-methacryloyloxyethyl tetrahydrophthalic acid, 2-acryloyloxyethyl hexahydrophthalic acid, and 2-methacryloyloxyethyl hexahydrophthalic acid; and a compound having two or more ethylenically unsaturated groups prepared by reacting dibasic acid anhydride with polyfunctional acrylate or polyfunctional methacrylate each having a hydroxyl group such as pentaerythritol triacrylate, pentaerythritol trimethacrylate, trimethylol propane diacrylate, trimethylol propane dimethacrylate, dipentaerythrithol pentaacrylate, and dipentaerythrithol pentamethaacrylate. One of these may be used alone, or two or more may be used together. Particularly, acrylic acid is preferably used. In this case, it is possible to suppress stickiness of a wet film made of the resin composition for masks while drops in the crack resistance and the bulge resistance are suppressed as possible.

In a case where both of the ω-carboxy-polycaprolactone monoacrylate and the acrylic acid are used, a ratio of the amount of the acrylic acid to the total amount of the both preferably falls within a range of 1 to 80 mol %, and particularly preferably falls within a range of 1 to 60 mol %. In this regard, the ratio of the amount of the ω-carboxy-polycaprolactone monoacrylate to the total amount of the ethylenically unsaturated compound having a carboxyl group preferably falls within a range of 20 to 99 mol %, and preferably falls within a range of 40 to 99 mol %, in particular.

In the synthesis of the first resin, the total amount of the ethylenically unsaturated compound having a carboxyl group is preferably selected in such a manner that an amount of the carboxyl group of the ethylenically unsaturated compound having the carboxyl group falls within a range of 0.7 to 1.2 mol per 1 mol of the epoxy group of the epoxy resin, and more preferably selected in such a manner that the amount of the carboxyl group of the ethylenically unsaturated compound falls within a range of 0.9 to 1.1 mol per 1 mol of the epoxy group of the epoxy resin. With the total amount within any one of the ranges, a remaining amount of the epoxy group in the first resin is particularly decreased, and therefore a thermosetting reaction is suppressed in a case where the resin composition for masks is left under heated and dry conditions of small pre-dried degrees. Hence, it is possible to suppress deterioration in developing properties of the resin composition for masks after exposure of light. Moreover, it is possible to reduce the amount of the ethylenically unsaturated compound having an epoxy group which is unreacted in the synthesis of the first resin.

Examples of the polybasic acid anhydride for synthesis of the first resin include: dibasic acid anhydride such as phthalic acid anhydride, tetrahydrophthalic acid anhydride, methyltetrahydrophthalic acid anhydride, methylnadic acid anhydride, hexahydrophthalic acid anhydride, methylhexahydrophthalic acid anhydride, succinic acid anhydride, methylsuccinic acid anhydride, maleic acid anhydride, cyclohexane-1,2,4-tricarboxylic acid-1,2-anhydride, citraconic acid anhydride, glutaric acid anhydride, and itaconic acid anhydride; and tri- or more basic acid anhydride such as trimellitic acid anhydride, pyromellitic acid anhydride, benzophenone tetracarboxylic acid anhydride, and methylcyclohexene tetracarboxylic acid anhydride. One of these may be used alone, or two or more may be used together.

A main object of use of the polybasic acid anhydride is to impart re-dispersibility and re-solubility in a dilute alkaline aqueous solution to the resin composition for masks by giving an acid value to the first resin. The amount of the polybasic acid anhydride is preferably adjusted to give the acid value of 30 mg KOH/g or more to the first resin, and more preferably adjusted to give the acid value of 60 mg KOH/g or more. The amount of the polybasic acid anhydride is preferably adjusted to give the acid value of 160 mg KOH/g or less to the first resin, and more preferably adjusted to give the acid value of 130 mg KOH/g or less.

The molecular weight of the first resin is not particularly limited, but the number average molecular weight thereof preferably falls within a range of 300 to 8000.

In the synthesis of the first resin, known methods may be adopted to make the addition reactions proceed between the epoxy resin and the ethylenically unsaturated compound having a carboxyl group and between the product prepared by the aforementioned addition reaction and the polybasic acid anhydride. For example, as for the addition reaction between the epoxy resin and the ethylenically unsaturated compound having a carboxyl group, the ethylenically unsaturated compound having a carboxyl group is added into a solution of the epoxy resin, and further a thermal polymerization inhibitor and a catalyst may be added thereto as requested, and thus-obtained solution is stirred and mixed to give a reactive solution. This reactive solution is reacted by a known method, and preferably is reacted at a reaction temperature of 60° C. to 150° C., and more preferably is reacted at the reaction temperature of 80° C. to 120° C. Consequently, the adduct is obtained. Examples of the thermal polymerization inhibitor include hydroquinone and hydroquinone monomethyl ether. Examples of the catalyst include: tertiary amines such as benzyldimethylamine and triethylamine; quaternary ammonium salts such as trimethylbenzylammonium chloride and methyltriethylammonium chloride; triphenylphosphine; and triphenylstibine.

In a process of making the addition reaction proceed between the adduct and the polybasic anhydride, the polybasic acid anhydride is added into a solution of the adduct, further a thermal polymerization inhibitor and a catalyst may be added thereto as requested, and thus-obtained solution is stirred and mixed to give a reactive solution. The reactive solution is reacted by a known method to give the first resin. Reaction conditions may be the same as those of the addition reaction between the epoxy resin and the ethylenically unsaturated compound having a carboxyl group. As the thermal polymerization inhibitor and the catalyst, those used in the addition reaction between the epoxy resin and the ethylenically unsaturated compound having a carboxyl group may be used as they are.

As a result of use of the aforementioned first resin, the flexibility of the cured product is highly improved as described above. Moreover, the cure shrinkage in curing the resin composition for masks is reduced, and reactivity of the resin composition for masks is improved. Such improvement of these properties may relate to a position and a density of the carboxyl group, a distance between the carboxyl group and a main chain, and the like.

b. Second Resin

The second resin has a structure prepared by an addition reaction of monocarboxylic acid with one of epoxy groups of polyfunctional epoxy resin and an addition reaction of polybasic acid with another of the epoxy groups. In the second resin, an epoxy group derived from the polyfunctional epoxy resin may remain without reacting with the monocarboxylic acid and the polybasic acid.

The second resin is composed of structural units represented by the following general formulae (1), (2), (3), and (4), respectively.

[Chemical formula 1]

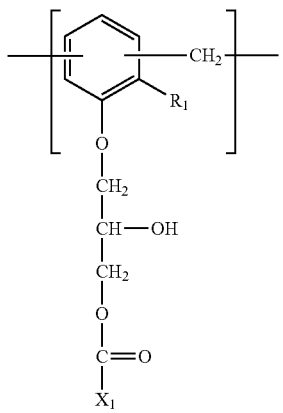

(1)

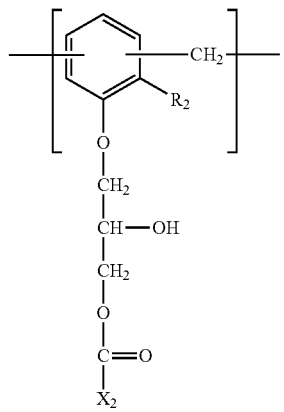

(2)

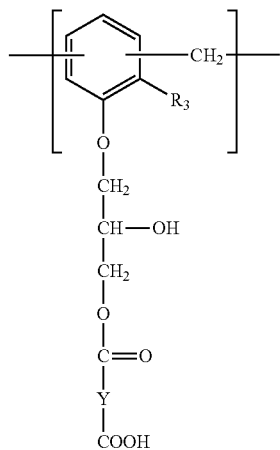

(3)

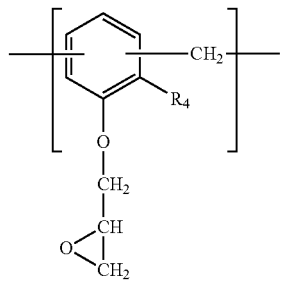

(4)

In the formulae, each of $R_1$ to $R_4$ represents a hydrogen atom or a methyl group. $X_1$ and $X_2$ represent the same carboxylic acid residue or different carboxylic acid residues. Y represents a dicarboxylic acid residue.

Examples of a synthetic method of the second resin include the following three aspects. The second resin synthesized by any of these aspects is less likely to gel. Note that the synthetic method of the second resin is not limited to these aspects.

In the first aspect, in the addition reaction between the polyfunctional epoxy resin and the ethylenically unsaturated compound having a carboxyl group, one or some of epoxy groups of polyfunctional epoxy resin reacts with monocarboxylic acid to give an adduct (a first intermediate). Subsequently, in an addition reaction between the first intermediate and the polybasic acid, at least one (one or some) of the remaining epoxy groups of the first intermediate reacts with polybasic acid to give the second resin.

In the second aspect, in an addition reaction between the polyfunctional epoxy resin and the ethylenically unsaturated compound having a carboxyl group, one or some of epoxy groups of polyfunctional epoxy resin reacts with monocarboxylic acid to give an adduct (a second intermediate). Subsequently, in an addition reaction between the second intermediate and the monocarboxylic acid, at least one (one or some) of the remaining epoxy groups of the second intermediate reacts with monocarboxylic acid to give the second resin.

In the third aspect, in the addition reaction between the polyfunctional epoxy resin and the ethylenically unsaturated compound having a carboxyl group, one or some of epoxy groups of polyfunctional epoxy resin reacts with monocarboxylic acid to give an adduct (a third intermediate). Subsequently, in an addition reaction between the third intermediate and the polybasic acid, at least one (one or some) of the remaining epoxy groups of the third intermediate reacts with polybasic acid to give a fourth intermediate. Furthermore, in an addition reaction between the fourth intermediate and the monocarboxylic acid, at least one (one or some) of the remaining epoxy groups of the fourth intermediate reacts with monocarboxylic acid to give the second resin.

The second resin has secondary alcoholic hydroxyl groups at side chains thereof, and therefore can show excellent developing properties. Furthermore, the second resin has an unsaturated group and a carboxyl group at ends of the side chains, and therefore the second resin is excellent in reactivity.

The polyfunctional epoxy resin used for preparing the second resin has preferably two or more epoxy groups per molecule. Examples of the polyfunctional epoxy resin include: bisphenol A epoxy resin; brominated epoxy resin; novolac epoxy resin; bisphenol F epoxy resin; hydrogenated bisphenol A epoxy resin; glycidyl amine epoxy resin; alicyclic epoxy resin; tris(hydroxyphenyl)methane-based epoxy resin; bixylenol or biphenol epoxy resin or a mixture thereof; and biphenyl aralkyl epoxy resin; bisphenol S epoxy resin; bisphenol A novolac epoxy resin; tetraphenylol ethane epoxy resin; heterocyclic epoxy resin; diglycidyl phthalate resin; tetraglycidyl xylenoylethane resin; naphthalene group-containing epoxy resin; epoxy resin having a dicyclopentadiene skeleton; glycidyl methacrylate copolymer-type epoxy resin; epoxy resin of copolymer of cyclohexylmaleimide and glycidyl methacrylate; polyfunctional epoxy resin (see, WO 01/024774 A) obtained by reacting bisphenol A epoxy resin with 1,5-dihydroxynaphtalene, and reacting an alcoholic secondary hydroxyl group of thus-obtained resin with epohalohydrin; and epoxy resin having a 1,3-dioxolane ring (JP2007-176987 A) obtained by an addition reaction between one of the epoxy groups with ketone. Examples of the bisphenol A epoxy resin include: jER828, jER834, jER1001, and jER1004 (all product names) available from Mitsubishi Chemical Corporation; and EPICLON840, EPICLON850, EPICLON1050, and EPICLON2055 (all product names) available from DIC Corporation; and EPOTHOTO YD-011, YD-013, YD-127, and YD-128 (all product names) available from NIPPON STEEL CHEMICAL CO., LTD.; and D.E.R.317, D.E.R.331, D.E.R.661, and D.E.R.664 (all product names) available from Dow Chemical Company; and SUMI-EPDXY ESA-011, ESA-014, ELA-115, and ELA-128 (all product names) available from Sumitomo Chemical Industries. Ltd. Examples of the brominated epoxy resin include: YL903 (product name) available from Mitsubishi Chemical Corporation; and EPICLON152 and EPICLON165 (product names) available from DIC Corporation; and EPOTHOTO YDB-400 and YDB-500 (product names) available from NIPPON STEEL CHEMICAL CO., LTD.; and D.E.R.542 (product name) available from Dow Chemical Company; and SUMI-EPDXY ESB-400 and ESB-700 (product names) available from Sumitomo Chemical Industries. Ltd. Examples of the novolac epoxy resin include: jER152 and jER154 (product names) available from Mitsubishi Chemical Corporation; and D.E.N.431, and D.E.N.438 (product names) available from Dow Chemical Company; and EPICLON N-730, EPICLON N-770, and EPICLON N-865 (product names) available from DIC Corporation; and EPOTHOTO YDCN-701 and YDCN-704 (product names) available from NIPPON STEEL CHEMICAL CO., LTD.; and EPPN-201, EOCN-1025, EOCN-1020, EOCN-104S, and RE-306 (product names) available from NIPPON KAYAKU CO., Ltd.; and SUMI-EPDXY ESCN-195× and ESCN-220 (product names) of available from Sumitomo Chemical Industries. Ltd. Examples of the bisphenol F epoxy resin include: EPICLON830 available from DIC Corporation; and jER807 (product name) available from Mitsubishi Chemical Corporation; and EPOTHOTO YDF-170, YDF-175, and YDF-2004 (product names) available from NIPPON STEEL CHEMICAL CO., LTD. Examples of the hydrogenated bisphenol A epoxy resin include EPOTHOTO ST-2004, ST-2007, and ST-3000 (product names) available from NIPPON STEEL CHEMICAL CO., LTD. Examples of the glycidyl amine epoxy resin include jER604 available from Mitsubishi Chemical Corporation, and EPOTHOTO YH-434 available from NIPPON STEEL CHEMICAL CO., LTD., and SUMI-EPDXY ELM-120 (product names) available from Sumitomo Chemical Industries. Ltd. Examples of the alicyclic epoxy resin include celoxide 2021 (product name) available from Daicel Corporation. Examples of the tris(hydroxyphenyl)methane-based epoxy resin include YL-933 available from Mitsubishi Chemical Corporation, EPPN-501 and EPPN-502 (all product names) available from NIPPON KAYAKU CO., Ltd. Examples of the bixylenol or biphenol epoxy resin such as YL-6056, YX-4000, and YL-6121 (all product names) available from Mitsubishi Chemical Corporation. Examples of the biphenyl aralkyl epoxy resin include NC-3000, NC-3000L, NC-3000H (all product names) available from NIPPON KAYAKU CO., Ltd. Examples of the bisphenol S epoxy resin include EBPS-200 available from NIPPON KAYAKU CO., Ltd., EPX-30 available from Asahi Denka Kogyo KK., and EXA-1514 (all product names) available from DIC Corporation. Examples of the bisphenol A novolac epoxy resin include jER157S (product name) available from Mitsubishi Chemical Corporation. Examples of the tetraphenylol ethane epoxy resin include YL-931 (product name) available from Mitsubishi Chemical Corporation. Examples of the heterocyclic epoxy resin include TEPIC (product name) available from NISSAN CHEMICAL INDUSTRIES, LTD. Examples of the diglycidyl phthalate resin include BLEMMER DGT (product name) available from Nippon Yushi Industry Co., Ltd. Examples of the tetraglycidyl xylenoylethane resin include ZX-1063 (product name) available from NIPPON STEEL CHEMICAL CO., LTD. Examples of the naphthalene group-containing epoxy resin such as ESN-190 and ESN-360 available from NIPPON STEEL CHEMICAL CO., LTD., and HP-4032, EXA-4750, and EXA-4700 (all product names) available from DIC Corporation. Examples of the epoxy resin having a dicyclopentadiene skeleton include HP-7200 and HP-7200H (all product names) available from DIC Corporation. Examples of the glycidyl methacrylate copolymer-type epoxy resin include CP-50S and CP-50M (all product names) available from Nippon Yushi Industry Co., Ltd. One of the aforementioned epoxy resins may be used alone, or two or more may be used with mixed.

Out of these epoxy resins, resin having three or more epoxy groups is preferable.

Examples of the monocarboxylic acid for obtaining the second resin include: monocarboxylic acid having an unsaturated group such as acrylic acid, methacrylic acid, crotonic acid, cinnamic acid, α-cinnamic acid, β-styrylacrylic acid, β-furfuryl acrylic acid, and ω-carboxy-polycaprolactone monoacrylate; saturated aliphatic monocarboxylic acid such as formic acid, acetic acid, propionic acid, n-butyric acid, isobutyric acid, valeric acid, trimethyl acetic acid, capronic acid, caprylic acid, pelargonic acid, capric acid, undecylic acid, lauric acid, tridecylic acid, myristic acid, pentadecylic acid, palmitic acid, heptadecanoic acid, stearic acid, nonadecanoic acid, arachidic acid, and behenic acid; and aromatic monocarboxylic acid such as benzoic acid, alkylated benzoic acid, alkyl-substituted and amino-substituted benzoic acid, halogenated benzoic acid, phenylacetic acid, anisic acid, benzoyl benzoic acid, and naphthoic acid. One of these monocarboxylic acids may be used alone, or two or more may be used with mixed. Particularly preferred are acrylic acid, methacrylic acid, and acetic acid.

Examples of the polybasic acid for obtaining the second resin include oxalic acid, malonic acid, succinic acid, glutaric acid, adipic acid, pimelic acid, suberic acid, azelaic acid, sebacic acid, maleic acid, fumaric acid, phthalic acid, isophthalic acid, terephthalic acid, tetrahydrophthalic acid, methanetricarboxylic acid, tricarballylic acid, benzentricarboxylic acid, and benzenetetracarboxylic acid. One of these may be used alone, or two or more of these may be used with mixed. Out of these, preferred is dicarboxylic acid soluble to a reaction solvent and/or soluble to the reaction solvent at a reaction temperature. More preferred are malonic acid, glutaric acid, maleic acid, tetrahydrophthalic acid, and phthalic acid. Particularly preferred are maleic acid, tetrahydrophthalic acid, and phthalic acid.

The addition reaction between the polyfunctional epoxy resin and the monocarboxylic acid is preferably conducted in the presence of a polymerization inhibitor and a catalyst in a solvent. In this case, a ratio of monocarboxylic acid, which is supplied to the reaction system, to one equivalent of the epoxy group of the polyfunctional epoxy resin preferably falls within a range of 0.3 to 0.9 mol, and more preferably falls within a range of 0.5 to 0.8 mol. With the ratio within any one of the ranges, gelation is less likely to occur at synthesis of the second resin, and the second resin has an improved developing properties in particular. The reaction temperature preferably falls within a range of 50° C. to 150° C., and more preferably falls within a range of 70° C. to 120° C.

Examples of the solvent used in the addition reaction, include: ketones such as methyl ethyl ketone and cyclohexanone; and aromatic hydrocarbons such as toluene, xylene, and tetramethyl benzene; and glycol ethers such as ethylene glycol monoethyl ether, ethylene glycol monomethyl ether, ethylene glycol monobutyl ether, diethylene glycol monoethyl ether, diethylene glycol monomethyl ether, diethylene glycol monobutyl ether, propylene glycol monomethyl ether, propylene glycol monoethyl ether, dipropylene glycol diethyl ether, and triethylene glycol monoethyl ether; and esters of acetic acid such as ethyl acetate, butyl acetate, ethylene glycol monoethyl ether acetate, ethylene glycol monobutyl ether acetate, diethylene glycol monoethyl ether acetate, diethylene glycol monobutyl ether acetate, propylene glycol monomethyl ether acetate, and dipropylene glycol monomethyl ether acetate; and alcohols such as ethanol, propanol, ethylene glycol, and propylene glycol; and aliphatic hydrocarbons such as octane and decane; and petroleum-based solvents such as petroleum ether, petroleum naphtha, hydrogenated petroleum naphtha, and solvent naphtha. Only one of these organic solvents may be used, or two or more may be used together.

Examples of the catalyst include: tertiary amines such as triethylamine; and quaternary ammonium salts such as triethylbenzylammonium chloride; and imidazole compounds such as 2-ethyl-4-methylimidazole; and phosphorus compounds such as triphenylphosphine; and a metal salt of an organic acid such as metal salts of naphtenic acid, lauric acid, stearic acid, oleic acid, and octoenoic acid, examples of the metal including lithium, chromium, zirconium, potassium, sodium. However, the catalyst is not limited to the above examples. Only one of these catalysts may be used alone, or two or more may be used together.

Examples of the polymerization inhibitor include hydroquinone, methylhydroquinone, hydroquinone monomethyl ether, catechol, pyrogallol, and phenothiazine. However, the polymerization inhibitor is not limited to them. Only one of these polymerization inhibitors may be used, and two or more may be used together.

In the first aspect, the addition reaction between the adduct (the first intermediate) and the polybasic acid is preferably conducted under the presence of the polymerization inhibitor and the catalyst in the solvent. In the conditions, a ratio of the polybasic acid, which is supplied to the reaction system, to one equivalent of the epoxy group remaining in the adduct preferably falls within a range of 0.15 to 3.0 mol, and more preferably falls within a range of 0.5 to 1.5 mol.

In the second aspect, the addition reactions between the adduct (the second intermediate) and the monocarboxylic acid and between the adduct (the second intermediate) and the polybasic acid are preferably conducted under the presence of the polymerization inhibitor and the catalyst in the solvent. In these conditions, a ratio of the monocarboxylic acid, which is supplied to the reaction system, to one equivalent of the epoxy group remaining in the adduct preferably falls within a range of 0.15 to 5.0 mol, and more preferably falls within a range of 0.5 to 2.0 mol. In these conditions, a ratio of the polybasic acid, which is supplied to the reaction system, to one equivalent of the epoxy group remaining in the adduct preferably falls within a range of 0.15 to 3.0 mol, and more preferably falls within a range of 0.5 to 1.5 mol.

In the third aspect, the addition reaction between the adduct (the third intermediate) and the polybasic acid is preferably conducted under the presence of the polymerization inhibitor and the catalyst in the solvent. In the conditions, a ratio of the polybasic acid, which is supplied to the reaction system, to one equivalent of the epoxy group remaining in the adduct preferably falls within a range of 0.15 to 0.95 mol, and more preferably falls within a range of 0.5 to 0.9 mol.

Furthermore, in the third aspect, the addition reaction between the fourth intermediate and the monocarboxylic acid is preferably conducted under the presence of the polymerization inhibitor and the catalyst in the solvent. In the conditions, a ratio of the monocarboxylic acid, which is supplied to the reaction system, to one equivalent of the epoxy group remaining in the fourth intermediate preferably falls within a range of 1.0 to 5.0 mol, and more preferably falls within a range of 1.01 to 2.0 mol.

In these aspects, a cross-link between the adducts is suppressed, and therefore gelation of the second resin is suppressed while the amount of the remaining unreacted polybasic acid is reduced. The reaction temperature falls within a range of 50° C. to 150° C., and more preferably falls within a range of 70° C. to 120° C.

Examples of the polymerization inhibitor and the catalyst for the addition reaction between the adduct and the polybasic acid are the same as those for the addition reaction between the polyfunctional epoxy resin and the monocarboxylic acid.

The acid value of the second resin preferably falls within a range of 20 to 200 mg KOH/g, and more preferably 33 to 150 mg KOH/g. The second resin with the acid value within the ranges imparts excellent properties in addition to excellent developing properties.

The molecular weight of the second resin is not particularly limited, but the number average molecular weight thereof preferably falls within a range of 300 to 8000.

In a case where the resin composition for masks contains the first resin and the second resin as described above, the resin composition for masks has higher reactivity, and therefore the cured product thereof with good physical properties is formed even when the resin composition for masks is subjected to one-stage heating. Moreover, when the resin composition for masks is used for filling a hole in a printed wiring board, formed is the cured product with high properties of the crack resistance, the bulge resistance, the protrusion resistance, and the like. This may be because the resin composition for masks continues to have a smaller cure shrinkage state even after formed into a coating film where unreacted carboxyl groups remains few after heat cure, since the resin composition for masks contains both of the first resin and the second resin.

Respective ratios of the first resin and the second resin to the resin composition for masks are not particularly limited, however, the first resin is preferably contained in a range of 30 to 70 mass %. In this case, the coating film becomes flexible, and therefore has excellent crack resistance and bulge resistance. Furthermore, the second resin is preferably contained in a range of 30 to 70 mass %. In this case, the reactivity of the resin composition for masks is improved. Therefore, the amount of the unreacted carboxyl groups after heat curing is reduced, and the protrusion resistance and the bulge resistance are furthermore improved.

(2) Epoxy Resin

The resin composition for masks preferably contains an epoxy compound having at least two epoxy groups per molecule. The resin composition containing the epoxy compound may be provided with thermosetting properties. The epoxy compound may be an epoxy compound that is hardly soluble to a solvent, a versatile epoxy compound that is soluble to a solvent, or the like. A type of the compound is not particularly limited. Preferred examples of the epoxy resin include: phenol novolac epoxy resin (e.g., EPICLON N-775 (item number) available from DIC Corporation); and cresol novolac epoxy resin (e.g., EPICLON N-695 (item number) available from DIC Corporation); and bisphenol A epoxy resin (e.g., jER1001 (item number) available from Mitsubishi Chemical Corporation); and bisphenol A novolac epoxy resin (e.g., EPICLON N-865 (item number) available from DIC Corporation); and bisphenol F epoxy resin (e.g., jER4004P (item number) available from Mitsubishi Chemical Corporation); and bisphenol S epoxy resin (e.g., EPICLON EXA-1514 (item number) available from DIC Corporation); and bisphenol AD epoxy resin; and biphenyl type epoxy resin (e.g., YX4000 (item number) available from Mitsubishi Chemical Corporation); and biphenyl aralkyl epoxy resin (e.g., NC-3000 (item number) available from NIPPON KAYAKU CO., Ltd.); and hydrogenated bisphenol A epoxy resin (e.g., ST-4000D (item number) available from NIPPON STEEL CHEMICAL CO., LTD.); and naphthalene epoxy resin (e.g., EPICLON HP-4032, EPICLON HP-4700, and EPICLON HP-4770 (all item numbers) available from DIC Corporation); and specialized bifunctional epoxy resin (e.g., YL7175-500 and YL7175-1000 available from Mitsubishi Chemical Corporation, and EPICLON TSR-960, EPICLON TER-601, EPICLON TSR-250-80BX, EPICLON 1650-75 MPX, EPICLON EXA-4850, EPICLON EXA-4816, EPICLON EXA-4822, and EPICLON EXA-9726 available from DIC Corporation; and YSLV-120TE (all item numbers) available from NIPPON STEEL CHEMICAL CO., LTD.); and bisphenol type epoxy resin other than those described above. As triglycidyl isocyanurate, particularly preferred is a β-type that has a structure of three epoxy groups aligned in the same direction regarding a S-triazine ring skeleton face, or a mixture of the β-type and α-type that has a structure where one epoxy group is connected in a different direction from other two epoxy groups regarding the S-triazine ring skeleton face.

The epoxy compound preferably contains epoxy resin containing phosphorus. In this case, flame retardancy of the cured product of the resin composition for masks is improved. Examples of the epoxy resin containing phosphorus include phosphorus acid modified bisphenol F epoxy resin (e.g., EPICLON EXA-9726 and EPICLON EXA-9710 (item numbers) available from DIC Corporation) and EPOTHOTO FX-305 (item number) available from NIPPON STEEL CHEMICAL CO., LTD.

The epoxy compound preferably contains liquid bifunctional epoxy resin. Particularly, the epoxy compound preferably contains at least one of liquid bisphenol A epoxy resin and liquid bisphenol F epoxy resin. In this case, the reactivity of the resin composition for masks for a thermosetting reaction is improved, and the cure shrinkage in curing is less likely to occur. Moreover, ensuring good fluidity of the resin composition for masks is facilitated while a drop in a solid content of the resin composition for masks is suppressed. Note that the epoxy compound may consist of the liquid bifunctional epoxy resin, or the epoxy compound may contain the liquid bifunctional epoxy resin and a compound other than the liquid bifunctional epoxy resin. In a case where the epoxy compound contains the liquid bifunctional epoxy resin and the compound other than the liquid bifunctional epoxy resin, the physical properties of the resin composition for masks may be adjusted by adjusting a type, a ratio, or the like of the compound other than the liquid bifunctional epoxy resin.

A ratio of the epoxy compound to the resin composition for masks is not particularly limited. However, when the composition has both of light curing properties and thermosetting properties, a ratio of a total content of the epoxy compound to the total solid content of the resin composition for masks preferably falls within a range of 0.1 to 50 mass %. When the composition has thermosetting properties, the ratio of the epoxy compound to the total solid content of the resin composition for masks preferably falls within a range of 0.1 to 70 mass %.

(3) Photopolymerization Initiator

The resin composition for masks may contain a photopolymerization initiator. When the resin composition for masks contains the photopolymerization initiator, the resin composition for masks is provided with light curing properties. When the resin composition for masks contains the epoxy compound and the photopolymerization initiator, the resin composition for masks is provided with both of thermosetting properties and light curing properties.

Examples of the photopolymerization initiator include benzoin and alkyl ethers thereof; and acetophenones such as acetophenone and benzyl dimethyl ketal; and anthraquinones such as 2-methyl anthraquinone; and thioxanthones such as 2,4-dimethyl thioxanthone, 2,4-diethyl thioxanthone, 2-isopropyl thioxanthone, 4-isopropyl thioxanthone, and 2,4-diisopropyl thioxanthone; and benzophenones such as benzophenone and 4-benzoyl-4'-methyldiphenylsulfide; and xanthones such as 2,4-diisopropylxanthone; and α-hydroxy ketones such as 2-hydroxy-2-methyl-1-phenyl-propane-1-one; a compound containing nitrogen such as 2-methyl-1-[4-(methylthio)phenyl]-2-morpholino-1-propanone; and an acylphosphine oxide-based photopolymerization initiator such as 2,4,6-trimethylbenzoyl-diphenyl-phosphine oxide (DAROCUR TPO), 2,4,6-trimethylbenzoyl-ethyl-phenyl-phosphinate (SPEEDCURE TPO-L), bis(2,4,6-trimethyl-benzoyl)-phenylphosphine oxide (IRGACURE 819), and bis (2,6-dimethoxybenzoyl)-2,4,4-trimethyl-pentylphosphine oxide (CGI 403); and an oxime ester compound such as 1,2-octanedione, 1-[4-phenylthio-2-(O-benzoyloxime)] (IRGACURE OXE 01), and ethanone, 1-[9-ethyl-6-(2-methyl-benzoyl)-9H-carbazol-3-yl]-1-(O-acetyl oxime) (IRGACURE OXE 02). Together with the photopolymerization initiator, used may be a known photopolymerization promoter and a known sensitizer and the like such as p-dimethyl-benzoic acid ethyl ester and tertiary amines (e.g., p-dimethylamino-benzoic acid isoamyl ester, and 2-dimethylamino ethylbenzoate). A photopolymerization initiator for exposure of visible light or near infrared light may be used as requested. One of these photopolymerization initiators may be used alone, or two or more of those may be used together. A sensitizer such as Coumarin derivatives (e.g., 7-diethylamino-4-methylcoumarin), a carbocyanine dye type sensitizer, and a xanthene dye type sensitizer may be used as a sensitizer for a laser exposure method, together with the photopolymerization initiator.

When the photopolymerization initiator contains the acylphosphine oxide-based photopolymerization initiator, the photopolymerization initiator preferably further contains α-hydroxy acetophenone. α-Hydroxy acetophenone is less susceptible to oxygen inhibition than the acylphosphine oxide-based photopolymerization initiator is, and is less likely to tarnish by heat. Therefore, when α-hydroxy acetophenone is used, curability of an outer face of the resin composition for masks at exposure of light is highly improved. Examples of α-hydroxy acetophenone include 1-hydroxy-cyclohexyl-phenyl-ketone (IRGACURE 184), 2-hydroxy-2-methyl-1-phenyl-propane-1-one (DAROCUR 1173), and 1-[4-(2-hydroxyethoxy)-phenyl]-2-hydroxy-2-methyl-1-propane-1-one (IRGACURE 2959).

When the resin composition for masks contains the acylphosphine oxide-based photopolymerization initiator and α-hydroxy acetophenone, an amount of the acylphosphine oxide-based photopolymerization initiator contained in the resin composition for masks preferably falls within a range of 0.1 to 20 mass %, and an amount of the α-hydroxy acetophenone contained in the resin composition for masks preferably falls within a range of 0.1 to 20 mass %. In this case, the resin composition for masks has sufficient light curing properties, hardness of the cured product is furthermore improved, and resistance of the cured product to developer is improved. Therefore, resistance to electroless nickel-plating of the cured product is particularly improved.

A preferred amount of the photopolymerization initiator contained in the resin composition for masks is selected appropriately in view of a balance between light curing properties of the resin composition for masks and physical properties of the cured product made of the resin composition for masks. Particularly, the amount of the photopolymerization initiator preferably falls within a range of 0.1 to 30 mass %, based on the total solid content of the resin composition for masks.

(4) Photopolymerizable Compound

When the resin composition for masks contains the photopolymerization initiator, the resin composition for masks preferably further contains a photopolymerizable compound in addition to the resin containing a carboxyl group.

The photopolymerizable compound may be selected from monomer and prepolymer both having photopolymerization properties. The photopolymerizable compound is used for the purpose of dilution of the resin composition for masks and adjustment of viscosity, acid value, and photopolymerization property, for example.

The photopolymerizable compound may be appropriate photopolymerizable monomer or prepolymer. Examples of the photopolymerizable compound include: monofunctional acrylate such as 2-hydroxy ethyl acrylate; and polyfunctional (meth)acrylate such as diethylene glycol di(meth)acrylate, trimethylolpropane di(meth)acrylate, trimethylolpropane tri (meth)acrylate, pentaerythritol tri(meth)acrylate, pentaerythritol tetra(meth)acrylate, dipentaerythritol penta(meth)acrylate, dipentaerythritol hexa(meth)acrylate, and ε-caprolactone modified pentaerythritol hexaacrylate. Only one of these compounds may be used, or two or more maybe used together.

The photopolymerizable compound preferably contains a compound containing phosphorus (photopolymerizable phosphorus compound). With the resin composition containing such a compound, flame retardancy of the cured product of the resin composition for masks is improved. Examples of the photopolymerizable phosphorus compound include 2-methacryloyloxyethyl acid phosphate (e.g., LIGHT ESTER P-1M and LIGHT ESTER P-2M (item numbers) available from KYOEISHA CHEMICAL CO., LTD.), 2-acryloyloxyethyl acid phosphate (e.g., LIGHT ESTER P-1A (item number) available from KYOEISHA CHEMICAL CO., LTD.), diphenyl-2-methacryloyloxyethyl phosphate (e.g., MR-260 (item number) available from Daihachi Kogyo Co., Ltd.), HFA series available from Showa Highpolymer Co. Ltd. (e.g., HFA-6007 and HFA-6003 (item numbers) that is an adduct of dipentaerythritol hexaacrylate and HCA, and HFA-6127 and HFA-3003 (item numbers) that is an adduct of caprolactone modified dipentaerythritol hexaacrylate and HCA).

When the photopolymerizable compound is used, an amount of photopolymerizable compound contained in the resin composition for masks preferably falls within a range of 0.05 to 40 mass %, based on the total amount of the resin composition for masks. Furthermore, the amount of photopolymerizable compound contained in the resin composition for masks is preferably 50 mass % or less, based on the total solid content of the resin composition for masks. With the amount of the photopolymerizable compound falling within any of the above ranges, it is possible to suppress excessive surface stickiness of a dry film made of the resin composition for masks.

(5) Organic Solvent

The resin composition for masks may contain an organic solvent, as requested. The organic solvent is used for the purpose of making the resin composition liquid or varnish and of adjusting viscosity, coating properties, and film-forming properties, and the like. Examples of the organic solvent include straight chain or branched secondary or polyvalent alcohols such as ethanol, propyl alcohol, isopropyl alcohol, hexanol, ethylene glycol; and ketones such as methyl ethyl ketone and cyclohexanone; aromatic hydrocarbons such as toluene and xylene; and a petroleum-type and aromatic-type mixed solvent such as swasol series available from MARUZEN PETROCHEMICAL CO., LTD and solvesso series available from EXXON MOBIL CHEMICAL CORPORATION; and cellosolves such as cellosolve and butyl cellosolve; carbitols such as carbitol and butyl carbitol; propylene glycol alkyl ethers such as propylene glycol methyl ether; and polypropylene glycol alkyl ethers such as dipropylene glycol methyl ether; esters of acetic acid such as ethyl acetate, butyl acetate, and cellosolve acetate; and dialkyl glycol ethers. Only one of these may be used, or two or more may be used together.

An amount of the organic solvent contained in the resin composition for masks is appropriately selected. The amount is preferably adjusted in such a manner that the organic solvent promptly volatilizes at preliminary dry for a film made of the resin composition for masks, namely, in such a manner that the organic solvent does not remain in the dry film. The amount of the organic solvent preferably falls within a range of 5 to 99.5 mass %, based on the total amount of the resin composition for masks. With the amount of the organic solvent falling within the range, good coating properties of the resin composition for masks and fill properties into a via hole or the like are retained. Note that the preferable organic solvent content is different depending on an application method, a filling method, and the like, and therefore it is preferable that the amount of the organic solvent is adjusted in accordance with the application method and the filling method.

(6) Other Resin

In addition to the aforementioned resin having a carboxyl group and the epoxy compound, the resin composition for masks may further contain: a thermosetting component such as blocked isocyanate (e.g., tolylene diisocyanate, morpholine diisocyanate, isophorone diisocyanate, and hexamethylene diisocyanate, which are blocked with caprolactam, oxime, or ester of malonic acid) and amino resin (e.g., melamine, n-butylated melamine resin, isobutylated melamine resin, butylated urea resin, and butylated melamine urea condensation copolymer resin, and benzoguanamine-based condensation copolymer resin); and ultraviolet curable epoxy (meth)acrylate; an adduct of (meth)acrylic acid to bisphenol A resin, phenol novolac resin, cresol novolac resin, or alicyclic epoxy resin; and a polymer compound such as diallyl phthalate resin, phenoxy resin, melamine resin, urethane resin, and fluorine resin.

(7) Filler

The resin composition for masks preferably contains filler. Examples of the filler include inorganic filler such as barium sulfate, crystalline silica, nano-silica, titanium oxide, carbon nanotube, talc, bentonite, aluminum hydroxide, and magnesium hydroxide. With containing such filler, a film made of the resin composition for masks has a smaller cure shrinkage. The ratio of the filler to the resin composition for masks is arbitrarily selected, but preferably falls within a range of 10 to 50 mass %. With the resin composition containing the filler within the range, the solid content of the resin composition for masks increases, and therefore a change in volume is suppressed in heating the resin composition for masks so as to be dried. Hence, the crack resistance of the cured product is furthermore improved.

(8) Others

As requested, the resin composition for masks may contains: a curing agent for curing the epoxy compound; and curing accelerator; a colorant such as a pigment; copolymer such as silicone and acrylate; a leveling agent; an agent such as silane coupling agent for providing adhesiveness; a thixotropic agent; a polymerization inhibitor; a halation preventing agent; a flame retardant; a defoamer; an antioxidant; a surfactant; and a polymer dispersant.

[Preparation of Resin Composition for Masks]

The resin composition for masks is prepared by formulating the components of raw material (raw material components) as described above and mixing them by a known method using a triple roll mill, a ball-mill, a sand-mill, or the like. Before this preparation, some of the components (e.g., the photopolymerizable compound, part of the organic solvent, and the epoxy resin) may be mixed and dispersed in advance, and other components may be mixed and dispersed separately. In this case, the resin composition for masks may be prepared by mixing them when used.

With regard to preparation of the resin composition for masks, in a case where the raw material components include the epoxy compound, the resultant resin composition for masks has a thermosetting property. In a case where the raw material components include the photopolymerization initiator, the resultant resin composition for masks has a light curable property. Furthermore, in a case where the raw material components include both of the epoxy compound and the photopolymerization initiator, the resultant resin composition used for masks has both light curing and thermosetting properties.

The resin composition for masks preferably has a solid content falling within a range of 70% to 99%. In this case, it is possible to suppress a change in volume in heating the resin composition for masks so as to be dried, and therefore the crack resistance of the cured product is improved in particular. Regarding thixotropy of the resin composition for masks, a thixotropic index (0.5 rpm/5 rpm) of the resin composition preferably falls within a range of 1.2 to 1.8. The thixotropic ratio (0.5 rpm/5 rpm) is a ratio of a low speed viscosity at 0.5 rpm to a high speed viscosity at 5 rpm, both viscosities being measured at 25° C. with using cone-plate type three degrees cone. When the thixotropic index is within the range, it is possible to reduce a drip of resist ink, and therefore the crack resistance of the cured product is further improved. Note that as described above, when the resin composition for masks contains the liquid bifunctional epoxy resin, it is possible to easily obtain the resin composition for masks having a high solid content and good fluidity.

[Filling Holes and Forming Solder Mask Layers]

The resin composition for masks of the present embodiment may be used for filling a hole such as a through-hole and a via-hole in the printed wiring board. Moreover, the resin composition for masks of the present embodiment may be used for forming a solder mask layer on the printed wiring board.

In the following, a first aspect of a method of filling the through-hole in the printed wiring board and forming the solder mask layer on this printed wiring board by use of the resin composition for masks of the present embodiment is described. According to the present aspect, with regard to a printed wiring board provided with a through-hole therein, the through-hole in the printed wiring board is filled with the resin composition for masks having light curing and thermosetting properties and the solder mask layer is formed on the surface of the printed wiring board by use of the same resin composition.

At first, a printed wiring board in which a through-hole is made is prepared. The through-hole is filled with the resin composition for masks by a screen printing method with using a squeegee and a printing plate having an opening corresponding to the through-hole in the printed wiring board. Note that the method of filling the through-hole with the resin composition for masks is not limited to such a screen printing method but an appropriate method may be available.

Subsequently, the resin composition for masks is applied onto a first surface of the printed wiring board in the thickness direction, and thereafter the resin composition is applied onto a second surface which is an opposite surface of the printed wiring board from the first surface. As the method of applying the resin composition for masks onto the surfaces, an appropriate method such as an immersing method, spraying, spin coating, roll coating, curtain-coating, and screen-printing may be adopted. Thereafter, preliminary drying is conducted to dry the resin compositions for masks present in the through-hole, on the first surface, and on the second surface of the printed wiring board. In the preliminary drying, the resin composition for masks is heated at 60° C. to 120° C. so as to evaporate the organic solvent therefrom.

Subsequently, a negative mask with a pattern is disposed directly or indirectly on each of dried films of the resin composition for masks on the first surface and second surface. Thereafter the dried films of the resin composition for masks are irradiated with active energy rays to expose the dried films to the rays with the negative masks. Examples of the negative mask include a photo tool such as a mask film and a dry plate. Such a photo tool has an exposing portion and a covering portion. The exposing portion has a pattern corresponding to a pattern of a desired solder mask layer and allows the active energy rays to pass. The covering portion is a portion of the photo tool other than the exposing portion, and blocks the active energy rays. Examples of the active energy rays include appropriate active energy rays such as ultraviolet light, visible light, and near infrared light, which are selected in accordance with constituents of the resin composition for masks. Ultraviolet light or the like is emitted from a light source such as a chemical lamp, a low pressure mercury lamp, a middle pressure mercury lamp, a high pressure mercury lamp, an ultrahigh pressure mercury lamp, xenon lamp, and metal halide lamp, for example.

Note that an exposing method is not limited to the above method using the negative mask, but an appropriate method may be adopted. For example, a direct imaging method such as laser exposing may be adopted.

After exposing, the negative masks are detached from the printed wiring board, and development is conducted to remove unexposed portions of the resin composition for masks. Exposed portions of the resin compositions for masks remaining on the first and second surfaces of the printed wiring board are formed into the solder mask layers while the resin composition for masks inside the through-hole is cured to form into a cured product, and consequently the through-hole is filled with the cured product.

For the development, appropriate developer may be used in accordance with a type of the resin composition for masks. Examples of the developer include an alkaline solution such as a sodium carbonate aqueous solution, a potassium carbonate aqueous solution, an ammonium carbonate aqueous solution, a sodium hydrogen carbonate aqueous solution, a potassium hydrogen carbonate aqueous solution, an ammonium hydrogen carbonate aqueous solution, a sodium hydroxide aqueous solution, a potassium hydroxide aqueous solution, an ammonium hydroxide aqueous solution, and a lithium hydroxide aqueous solution. Furthermore, examples of the developing solution include, in addition to the above alkaline solution, organic amines such as monoethanolamine, diethanolamine, triethanolamine, monoisopropanolamine, diisopropanolamine, and triisopropanolamine. One of these may be used alone, or two or more may be used together. The solvent of the alkaline solution may be water or a mixture of water and a hydrophilic organic solvent (e.g., lower alcohols).

Furthermore, the solder mask layer and the cured product inside the through-hole are subjected to heat treatment (e.g., heated at 120° C. to 180° C. for 30 to 90 min) to promote thermosetting reactions in the solder mask layer and the cured product. Accordingly, strength, hardness, chemical resistance, and the like of the solder mask layer and the cured product are improved.

Note that in the aspect, the resin compositions for masks in the through-hole and on the first surface and the second surface are subjected to exposure and development at once after the through-hole is filled with the resin composition for masks while the resin composition for masks is applied onto the first surface and second surface. However, timing for the exposure and development is not limited to this. For example, the through-hole is filled with the resin composition for masks, and then the resin composition for masks in the through-hole may be exposed to form a cured product before the resin composition for masks is applied onto each of the first surface and the second surface, and subsequently the resin composition for masks may be applied onto each of the first surface and the second surface, and then subjected to exposure and development. In another way, the resin composition for masks is applied onto the first surface, and subsequently may be subjected to exposure and development before the resin composition for masks is applied onto the second surface, and thereafter the resin composition for masks may be applied onto the second surface and subsequently subjected to exposure and development. The through-hole is filled with the resin composition for masks in this aspect. However, when a printed wiring board has a via hole, the via hole may be filled with the resin composition for masks.

As described above, in a case where a hole in the printed wiring board is filled with the resin composition for masks of the present embodiment, the cured product with high properties of the crack resistance, the bulge resistance, the protrusion resistance, and the like is formed even when only one-stage heating is conducted after irradiation with the active energy rays.

Next, described is a second aspect of the method of filling the through-hole in the printed wiring board and further making the solder mask layer on this printed wiring board. In the present aspect, the through-hole in the printed wiring board having the through-hole is filled with the thermosetting resin composition for masks while the solder mask layer is formed on a surface of the printed wiring board.

At first, a printed wiring board in which a through-hole is made is prepared. The through-hole is filled with the resin composition for masks by a screen printing method with using a squeegee and a printing plate having an opening corresponding to the through-hole in the printed wiring board. Note that the method of filling the through-hole with the resin composition for masks is not limited to such a screen printing method but an appropriate method may be adopted.

Subsequently, the resin composition for masks is applied onto a first surface of the printed wiring board in the thickness direction so as to form a patterned film of the resin composition for masks, and thereafter the resin composition for masks is also applied onto a second surface which is an opposite surface of the printed wiring board from the first surface so as to form a patterned film of the resin composition for masks. As an application method for the resin composition for masks, an appropriate method such as screen-printing may be adopted.

Thereafter, preliminary drying is conducted to dry the resin compositions for masks present in the through-hole, on the first surface, and on the second surface of the printed wiring board. In the preliminary drying, the resin composition for masks is heated at 60° C. to 120° C. so as to evaporate the organic solvent therefrom.

Subsequently, the solder mask layer and the cured product inside the through-hole are subjected to heat treatment (e.g., heated at 120° C. to 180° C. for 30 to 90 min) to promote thermosetting reactions in the solder mask layer and the cured product. Accordingly, the resin compositions for masks on the first and second surfaces are cured to form into the solder mask layers while the resin composition for masks in the through-hole is cured to form into a cured product, and consequently the through-hole is filled with the cured product.

Note that in the aspect, the resin compositions for masks in the through-hole and on the first and second surfaces are cured by means of heating at once after the through-hole is filled with the resin composition for masks and the resin composition for masks is applied onto each of the first and second surfaces. However, timing for heating is not limited to this. For example, the through-hole is filled with the resin composition for masks, and then the resin composition for masks in the through-hole may be heated to form into a cured product before the resin composition for masks is applied onto each of the first and second surfaces, and subsequently the resin compositions for masks on each of the surfaces may be heated. In another way, the resin composition for masks is applied onto the first surface and then the resin composition for masks on the first surface may be heated before the resin composition for masks is applied onto the second surface, and subsequently the resin composition for masks may be applied onto the second surface and then the resin composition for masks on the second surface may be heated. In the present aspect, the through-hole is filled with the resin composition for masks. However, when a printed wiring board has a via hole; the via hole may be filled with the resin composition for masks.

As described above, in a case where a hole in the printed wiring board is filled with the resin composition for masks of the present embodiment, the cured product with high properties of the crack resistance, the bulge resistance, the protrusion resistance, and the like is formed even when one-stage heating after irradiation with the active energy ray is conducted.

EXAMPLES

Synthetic Example A-1

A reflux condenser, a thermometer, a bleed tube, and a stirrer were set to a four-necked flask. In order to prepare a reaction solution, 919 parts by mass of bisphenol A epoxy resin (jER1004 (item number) available from Mitsubishi Chemical Corporation, epoxy equivalent weight: 919), 470 parts by mass of diethylene glycol monoethyl ether acetate, 0.2 parts by mass of hydroquinone, 300 parts by mass of ω-carboxy-polycaprolactone (n≈2) monoacrylate (Aronix M-5300 (trade name) available from TOAGOSEI CO., LTD., the number average molecular weight: 290), and 3 parts by mass of triphenyl phosphine were added to the four-necked flask. The reaction solution was heated at 115° C. for 12 hours with air bubbled therein to cause the addition reaction. Subsequently, into thus-obtained solution in the four-necked flask, 249 parts by mass of succinic acid anhydride and 322 parts by mass of diethylene glycol monoethyl ether acetate were added, and then thus-obtained solution was heated at 110° C. for 5 hours to react them. Consequently, a 65 mass % solution (carboxyl group containing resin solution A-1) of resin containing a carboxyl group was obtained, the resin having the number average molecular weight of about 3700.

Synthetic Example A-2

A reflux condenser, a thermometer, a bleed tube, and a stirrer were set to a four-necked flask. In order to prepare a reaction solution, 919 parts by mass of bisphenol A epoxy resin (jER1004 (item number) available from Mitsubishi Chemical Corporation, epoxy equivalent weight: 919), 470 parts by mass of diethylene glycol monoethyl ether acetate, 0.2 parts by mass of hydroquinone, 180 parts by mass of ω-carboxy-polycaprolactone (n≈2) monoacrylate (Aronix M-5300 (trade name) available from TOAGOSEI CO., LTD., the number average molecular weight: 290), 28.8 parts of acrylic acid, and 3 parts by mass of triphenyl phosphine were added to the four-necked flask. The reaction solution was heated at 115° C. for 12 hours with air bubbled therein to cause the addition reaction. Subsequently, into thus-obtained solution in the four-necked flask, 166.1 parts by mass of succinic acid anhydride, 126.1 parts by mass of tetrahydrophthalic acid anhydride, and 296.5 parts by mass of diethylene glycol monoethyl ether acetate were added, and then thus-obtained solution was heated at 110° C. for 5 hours to react them. Consequently, a 65 mass % solution (carboxyl group containing resin solution A-2) of resin containing a carboxyl group was obtained, the resin having the number average molecular weight of about 3400.

Synthetic Example A-3

A reflux condenser, a thermometer, a bleed tube, and a stirrer were set to a four-necked flask. In order to prepare a reaction solution, 472 parts by mass of bisphenol A epoxy resin (jER1001 (item number) available from Mitsubishi Chemical Corporation, epoxy equivalent weight: 472), 293 parts by mass of diethylene glycol monoethyl ether acetate, 0.2 parts by mass of hydroquinone, 180 parts by mass of ω-carboxy-polycaprolactone (n≈2) monoacrylate (Aronix M-5300 (trade name) available from TOAGOSEI CO., LTD., the number average molecular weight: 290), 28.8 parts of acrylic acid, and 3 parts by mass of triphenyl phosphine were added to the four-necked flask. The reaction solution was heated at 115° C. for 12 hours with air bubbled therein to cause the addition reaction. Subsequently, into thus-obtained solution in the four-necked flask, 99.7 parts by mass of succinic acid anhydride, 75.7 parts by mass of tetrahydrophthalic acid anhydride, and 327.5 parts by mass of diethylene glycol monoethyl ether acetate were added, and then thus-obtained solution was heated at 110° C. for 5 hours to react them. Consequently, a 65 mass % solution (carboxyl group containing resin solution A-3) of resin containing a carboxyl group was obtained, the resin having the number average molecular weight of about 2300.

Synthetic Example B-1

A reflux condenser, a thermometer, a bleed tube, and a stirrer were set to a four-necked flask. 203 parts by mass of cresol novolac epoxy resin "YDCN-700-5" (available from NIPPON STEEL CHEMICAL CO., LTD., epoxy equivalent weight: 203), 105 parts by mass of diethylene glycol monoethyl ether acetate, 0.2 parts by mass of methylhydroquinone, 43.2 parts by mass of acrylic acid, and 3 parts by mass of triphenyl phosphine were added into the four-necked flask, followed by heating at 100° C. for 3 hours to react them. Subsequently, 68 parts by mass of tetrahydrophthalic acid, 0.3 parts by mass of methylhydroquinone, and 65 parts by mass of diethylene glycol monoethyl ether acetate were added thereto, and then thus-obtained solution was heated at 100° C. for 6 hours to react them. Consequently, a 65 mass % solution (carboxyl group containing resin solution B-1) of resin containing a carboxyl group was obtained, the resin having the number average molecular weight of about 2700.

Thus-obtained solution of the resin containing a carboxyl group has a solid content acid value of 72 mg KOH/g and an epoxy equivalent weight of 9871 g/eq.

Synthetic Example B-2

A reflux condenser, a thermometer, a bleed tube, and a stirrer were set to a four-necked flask. 203 parts by mass of cresol novolac epoxy resin "YDCN-700-5" (available from NIPPON STEEL CHEMICAL CO., LTD., epoxy equivalent weight: 203), 105 parts by mass of diethylene glycol monoethyl ether acetate, 0.2 parts by mass of methylhydroquinone, 36 parts by mass of acrylic acid, and 3 parts by mass of triphenyl phosphine were added into the four-necked flask, followed by heating at 100° C. for 3 hours to react them. Subsequently, 66.4 parts by mass of phthalic acid, 0.3 parts by mass of methylhydroquinone, and 65 parts by mass of diethylene glycol monoethyl ether acetate were added thereto, and then thus-obtained solution was heated at 100° C. for 2 hours to react them, and thereafter 8.4 parts by mass of acetic acid was further added thereto, followed by heating to 100° C. for 2 hours to react them. Consequently, a 65 mass % solution (carboxyl group containing resin solution B-2) of resin containing a carboxyl group was obtained, the resin having the number average molecular weight of about 2900. Thus-obtained solution of the resin containing a carboxyl group has a solid content acid value of 88 mg KOH/g and an epoxy equivalent weight of 5465 g/eq.

Synthetic Example B-3

A reflux condenser, a thermometer, a bleed tube, and a stirrer were set to a four-necked flask. Into the four-necked flask, 162.2 parts by mass of cresol novolac epoxy resin "YDCN-700-5" (available from NIPPON STEEL CHEMICAL CO., LTD., epoxy equivalent weight: 203), 37.2 parts by mass of bisphenol A epoxy resin "jER828" (available from Mitsubishi Chemical Corporation, epoxy equivalent weight: 186), 105 parts by mass of diethylene glycol monoethyl ether acetate, 0.2 parts by mass of methylhydroquinone, 36 parts by mass of acrylic acid, and 3 parts by mass of triphenyl phosphine were added, followed by heating at 100° C. for 3 hours to react them. Subsequently, 46.4 parts by mass of maleic acid, 0.3 parts by mass of methylhydroquinone, and 55 parts by mass of diethylene glycol monoethyl ether acetate were added thereto, and then thus-obtained solution was heated to 100° C. for 2 hours to react them, and thereafter 14.4 parts by mass of acrylic acid was further added thereto, followed by heating at 100° C. for 4 hours to react them. Consequently, a 65 mass % solution (carboxyl group containing resin solution B-3) of resin containing a carboxyl group was obtained, the resin having the number average molecular weight of about 2500. Thus-obtained solution of the resin containing a carboxyl group has a solid content acid value of 100 mg KOH/g and an epoxy equivalent weight of 7099 g/eq.

Synthetic Example C-1

A reflux condenser, a thermometer, a bleed tube, and a stirrer were set to a four-necked flask. In order to prepare a reaction solution, 919 parts by mass of bisphenol A epoxy resin (jER1004 (item number) available from Mitsubishi Chemical Corporation, epoxy equivalent weight: 919), 470 parts by mass of diethylene glycol monoethyl ether acetate, 0.2 parts by mass of hydroquinone, 72 parts by weight of acrylic acid, and 3 parts by mass of triphenyl phosphine were added to the four-necked flask. The reaction solution was heated at 115° C. for 12 hours with air bubbled therein to cause the addition reaction. Subsequently, into thus-obtained solution in the four-necked flask, 249 parts by mass of succinic acid anhydride and 195 parts by mass of diethylene glycol monoethyl ether acetate were added, and then thus-obtained solution was heated at 110° C. for 5 hours to react them. Consequently, a 65 mass % solution (carboxyl group containing resin solution C-1) of resin containing a carboxyl group was obtained.

Synthetic Example C-2

A reflux condenser, a thermometer, a bleed tube, and a stirrer were set to a four-necked flask. In order to prepare a reaction solution, 212 parts by mass of cresol novolac epoxy resin (N-695 (item number) available from DIC Corporation, epoxy equivalent weight: 212), 221 parts by mass of diethylene glycol monoethyl ether acetate, 0.2 parts by mass of hydroquinone, 300 parts by mass of ω-carboxy-polycaprolactone monoacrylate (Aronix M-5300 (trade name) available from TOAGOSEI CO., LTD., the number average molecular weight: 290), and 3 parts by mass of triphenyl phosphine were added to the four-necked flask. The reaction solution was heated at 115° C. for 12 hours with air bubbled therein to cause the addition reaction. Subsequently, into thus-obtained solution in the four-necked flask, 76 parts by mass of tetrahydrophthalic acid anhydride and 97.3 parts by mass of diethylene glycol monoethyl ether acetate were added, and then thus-obtained solution was heated at 110° C. for 5 hours to react them. Consequently, a 65 mass % solution (carboxyl group containing resin solution C-2) of resin containing a carboxyl group was obtained.

Synthetic Example C-3

A reflux condenser, a thermometer, a bleed tube, and a stirrer were set to a four-necked flask. In order to prepare a reaction solution, 203 parts by mass of cresol novolac epoxy resin "YDCN-700-5" (available from NIPPON STEEL CHEMICAL CO., LTD., epoxy equivalent weight: 203), 103 parts by mass of diethylene glycol monoethyl ether acetate, 0.2 parts by mass of hydroquinone, 72.7 parts by mass of acrylic acid, and 0.6 parts by mass of dimethyl benzyl amine were added to the four-necked flask. The reaction solution was heated at 110° C. for 10 hours to cause the addition reaction. Subsequently, into thus-obtained solution in the four-necked flask, 60.8 parts by mass of tetrahydrophthalic acid anhydride and 78.9 parts by mass of diethylene glycol monoethyl ether acetate were added, and then thus-obtained solution was heated at 81° C. for 3 hours to react them. Consequently, a 65 mass % solution (carboxyl group containing resin solution C-3) of resin containing a carboxyl group was obtained.

[Preparation of Resin Composition for Masks]

The resin composition for masks was obtained by mixing the mixture with three-rolls, the mixture being obtained by blending raw materials formulated as shown in Table 1 for Examples and Comparative Examples.

[Evaluation Test]

(Preparation of Test Pieces Regarding Examples 1 to 9 and Comparative Examples 1 to 5)

A copper laminated glass-epoxy substrate board was prepared. The copper laminated glass-epoxy substrate board included copper foil with the thickness of 60 μm and had a through-hole with the diameter of 0.6 mm. The copper laminated glass-epoxy substrate board was subjected to etching treatment to form a patterned conductor, and consequently a printed wiring board was obtained. The through-hole of the printed wiring board was filled with the resin composition for masks by the screen-printing method. Thereafter, the resin composition for masks was applied onto an entire first surface of the printed wiring board, the first surface being orthogonal to the thickness direction of the printed wiring board. Subsequently the resin composition for masks was also applied onto an entire second surface which is an opposite surface of the resin composition for masks from the first surface. Thereafter, the resin composition for masks applied onto the printed wiring board was pre-dried through heating at 80° C. for 35 min. Accordingly, dried coating films with the thickness of 20 μm were formed on the first surface and the second surface. The dried coating films were irradiated with the ultraviolet rays with an exposure amount appropriate to the resin composition for masks while a negative mask was disposed directly on surfaces of the dried coating films. By means of that, dried coating films were selectively exposed and the resin composition for masks inside the through-hole was also exposed. After exposure, the dried coating films were subjected to development with a sodium carbonate solution in such a manner to leave the solder mask layers, which were portions of the dried coating films cured by the exposure, on the board. Consequently, the test piece including the solder mask layer and the cured product with which the through-hole was filled was obtained.

(Preparation of Test Pieces Regarding Examples 10 to 13 and Comparative Examples 6 to 9)

A copper laminated glass-epoxy substrate board was prepared. The copper laminated glass-epoxy substrate board included copper foil with the thickness of 60 μm and had a through-hole with the diameter of 0.6 mm. The copper laminated glass-epoxy substrate board was subjected to etching treatment to form a patterned conductor, and consequently a printed wiring board was obtained. The through-hole of the printed wiring board was filled with the resin composition for masks by a screen-printing method. Thereafter, the resin composition for masks was applied onto a first surface of the printed wiring board in such a manner to form a patterned film of the resin composition for masks, the first surface being orthogonal to the thickness direction of the printed wiring board. Subsequently, the resin composition for masks was also applied onto a second surface which was an opposite surface of the printed wiring board from the first surface to form a patterned film of the resin composition for masks. Thereafter, the resin composition for masks applied onto the printed wiring board was pre-dried through heating at 80° C. for 35 min. Accordingly, dried coating films with the thickness of 20 μm were formed respectively on the first surface and the second surface. Thereafter, the dried coating films and the resin composition for masks in the through-hole were cured through heating at 150° C. for 60 min. Consequently, the test piece including the solder mask layer and the cured product with which the through-hole was filled was obtained.

(Acid Resistance)

Appearance of the solder mask layer was observed after the test piece was immersed into a 10% sulfonic acid aqueous solution for 30 min at room temperature. The results were classified into the following ratings.

A: No abnormality occurs.
B: Small change is observed.
C: Great change such as peeling of the film is observed.

(Alkali Resistance)

Appearance of the solder mask layer was observed after the test piece was immersed into a 10% sodium hydroxide aqueous solution for 30 min at room temperature. The results were classified into the following ratings.

A: No abnormality occurs.
B: Small change is observed.
C: Great change such as peeling of the film is observed.

(Adhesiveness)

According to the test method of JIS D0202, the solder mask layer of the test piece was cross-cut in a grid manner to make cross-cut sections on the surface and subsequently the peeling state thereof was visually observed after the peeling test with a cellophane adhesive tape. The results were classified into the following ratings.

A: None of the 100 cross-cut sections is changed.
B: 1 to 10 of the 100 cross-cut sections are peeled off.
C: 11 to 100 of the 100 cross-cut sections are peeled off.

(Resistance to Plating)

The test piece was subjected to plating with using an electroless nickel-plating bath and an electroless gold plating bath which were commercially available. The state of the plate was observed. Moreover, adhesiveness of the solder mask layer after plating was observed by conducting the peeling test with a cellophane adhesive tape for the solder mask layer. The results were classified into the following ratings.

A: There is no change in appearance, no exfoliation of the solder mask layer in peeling the tape off, and no extension of the plating between the solder mask layer and the board.
B: There is no change in appearance but partial exfoliation of the solder mask layer is observed after the tape is peeled off.
C: Lift of the solder mask layer is observed, and exfoliation of the solder mask layer is observed after the tape is peeled off.

(Solder Heat Resistance)

As a flux, "LONCO 3355-11" (water-soluble flux available from LONDON Chemical Co., Ltd.) was used. At first, the flux was applied onto the test piece, and thus-obtained piece was immersed into a molten solder bath at 260° C. for 10 seconds, followed by washing with water. Appearance of the solder mask layer after subjected to this cycle twice was observed. The results were classified into the following ratings.

A: No abnormality occurs.
B: Some changes are observed.
C: Great change such as peeling of the solder mask layer is observed.

(Pencil Hardness)

The pencil hardness of the solder mask layer of the test piece was measured according to JIS K5400 with using Mitsubishi high-uni (available from Mitsubishi Pencil Co., Ltd).

(Electrical Corrosion Resistance)

A printed wiring board for evaluation was obtained by forming a solder mask layer in the same manner as that of the test piece on the IPC B-25 interdigitated array electrodes B coupon. The printed wiring board for evaluation was left under conditions of 40° C. and 90% R. H. for 500 hours with bias voltage of DC 100V being applied to the interdigitated array electrodes. The presence or absence of migration on the printed wiring board after this test was confirmed. The results were classified into the following ratings.

A: No migration is confirmed.
B: Some migration is confirmed.
C: Migration occurs.

(Crack Resistance)

A flux (water-soluble flux "LONCO 3355-11" (item number) available from LONDON Chemical Co., Ltd.) was applied onto the test piece. Subsequently, the test piece was immersed into a melting solder bath at 290° C. for 30 seconds, followed by washing with water. Thereafter, the solder mask in the through-hole was observed. The results were classified into the following ratings.

A: No crack occurs in all through-holes, out of 240 through-holes.

B: Cracks occur in 1 to 4 through-holes, out of 240 through-holes.

C: Cracks occur in 5 or more through-holes, out of 240 through-holes.

(Bulge Resistance)

A flux (water-soluble flux "LONCO 3355-11" (item number) available from LONDON Chemical Co., Ltd.) was applied onto the test piece. Subsequently, the test piece was immersed into a melting solder bath at 290° C. for 30 seconds, followed by washing with water. Thereafter, the state of whether peeling occurs or not in the cured product in the through-hole and the solder mask layer was observed after conducting the tape peeling test for the test piece. The results were classified into the following ratings.

A: No peeling occurs in all through-holes, out of 240 through-holes.

B: Peeling occurs in 1 to 4 through-holes, out of 240 through-holes.

C: Peeling occurs in 5 or more through-holes, out of 240 through-holes.

(Protrusion Resistance)

Onto the test piece, a flux (water-soluble flux "LONCO 3355° 11" (item number) available from London Chemical Co., Ltd.) was applied. Subsequently, thus-obtained test piece was immersed into a molten solder bath at 290° C. for 30 seconds, followed by washing with water. Thereafter, the cured product in the through-hole and the solder mask layer in the test piece were observed. The results were classified into the following ratings.

A: No protrusion of the cured product occurs in all through-holes, out of 240 through-holes.

B: Protrusions of the cured product occur in 1 to 4 through-holes, out of 240 through-holes.

C: Protrusions of the cured product occur in 5 or more through-holes, out of 240 through-holes.

(Test Results)

The following tables show evaluation test results as described above.

TABLE 1

| | Examples | | | | | | | | | Comparative Examples | | | | |
|---|---|---|---|---|---|---|---|---|---|---|---|---|---|---|
| | 1 | 2 | 3 | 4 | 5 | 6 | 7 | 8 | 9 | 1 | 2 | 3 | 4 | 5 |
| Carboxyl group containing resin solution A-1 | 77 | | | | | | | | | | | | | |
| Carboxyl group containing resin solution A-2 | | 77 | | 115 | 115 | 39 | 39 | 77 | 77 | 154 | | | | 77 |
| Carboxyl group containing resin solution A-3 | | | 77 | | | | | | | | | | | |
| Carboxyl group containing resin solution B-1 | 77 | 77 | 77 | 39 | 39 | 115 | 115 | | | | 154 | 77 | 77 | |
| Carboxyl group containing resin solution B-2 | | | | | | | | 77 | | | | | | |
| Carboxyl group containing resin solution B-3 | | | | | | | | | 77 | | | | | |
| Carboxyl group containing resin solution C-1 | | | | | | | | | | | | 77 | | |
| Carboxyl group containing resin solution C-2 | | | | | | | | | | | | | 77 | |
| Carboxyl group containing resin solution C-3 | | | | | | | | | | | | | | 77 |
| Epoxy compound A | 35 | 35 | 35 | 35 | 27 | 35 | 30 | 35 | 35 | 35 | 35 | 35 | 35 | 35 |
| Epoxy compound B | | | | | 10 | | | | | | | | | |
| Epoxy compound C | | | | | | | 14 | | | | | | | |
| Photopolymerizable monomer | 16 | 16 | 16 | 16 | 16 | 16 | 16 | 16 | 16 | 16 | 16 | 16 | 16 | 16 |
| Photopolymerizable initiator A | 16 | 16 | 16 | 16 | 16 | 16 | 16 | 16 | 16 | 16 | 16 | 16 | 16 | 16 |
| Photopolymerizable initiator B | 2 | 2 | 2 | 2 | 2 | 2 | 2 | 2 | 2 | 2 | 2 | 2 | 2 | 2 |
| Filler A | 50 | 50 | 50 | 50 | 50 | 50 | 50 | 50 | 50 | 50 | 50 | 50 | 50 | 50 |
| Filler B | 100 | 100 | 100 | 100 | 100 | 100 | 100 | 100 | 100 | 100 | 100 | 100 | 100 | 100 |
| Filler C | 3 | 3 | 3 | 3 | 3 | 3 | 3 | 3 | 3 | 3 | 3 | 3 | 3 | 3 |
| Melamine resin | 4 | 4 | 4 | 4 | 4 | 4 | 4 | 4 | 4 | 4 | 4 | 4 | 4 | 4 |
| Defoamer | 3 | 3 | 3 | 3 | 3 | 3 | 3 | 3 | 3 | 3 | 3 | 3 | 3 | 3 |
| Colorant | 1 | 1 | 1 | 1 | 1 | 1 | 1 | 1 | 1 | 1 | 1 | 1 | 1 | 1 |
| Organic solvent | 14 | 14 | 14 | 14 | 18 | 14 | 20 | 14 | 14 | 14 | 14 | 14 | 14 | 14 |
| Acid resistance | A | A | A | A | A | A | A | A | A | A | A | A | A | A |
| Alkali resistance | A | A | A | A | A | A | A | A | A | A | A | A | A | A |
| Adhesiveness | A | A | A | A | A | A | A | A | A | A | A | A | A | A |
| Resistance to plating | A | A | A | B | B | A | A | B | B | A | A | A | A | A |

TABLE 1-continued

|  | Examples ||||||||| Comparative Examples |||||
| --- | --- | --- | --- | --- | --- | --- | --- | --- | --- | --- | --- | --- | --- | --- |
|  | 1 | 2 | 3 | 4 | 5 | 6 | 7 | 8 | 9 | 1 | 2 | 3 | 4 | 5 |
| Solder heat resistance | A | A | A | B | A | A | A | A | B | B | A | A | A | A |
| Pencil hardness | 5H | 5H | 5H | 4H | 5H | 5H | 5H | 5H | 4H | 4H | 6H | 5H | 6H | 6H |
| Electrical corrosion resistance | A | A | A | A | A | A | A | A | A | A | A | A | A | A |
| Crack resistance | A | A | A | A | B | B | A | A | A | A | C | C | C | C |
| Bulge resistance | A | A | A | B | B | A | A | A | A | C | A | B | C | C |
| Protrusion resistance | A | A | A | A | A | A | B | A | A | A | A | A | C | C |

TABLE 2

|  | Examples |||| Comparative Examples ||||
| --- | --- | --- | --- | --- | --- | --- | --- | --- |
|  | 10 | 11 | 12 | 13 | 6 | 7 | 8 | 9 |
| Carboxyl group containing resin solution A-1 |  |  |  |  |  |  |  |  |
| Carboxyl group containing resin solution A-2 | 77 | 115 | 39 | 77 | 154 |  |  | 77 |
| Carboxyl group containing resin solution A-3 |  |  |  |  |  |  |  |  |
| Carboxyl group containing resin solution B-1 | 77 | 39 | 115 |  |  | 154 | 77 |  |
| Carboxyl group containing resin solution B-2 |  |  |  | 77 |  |  |  |  |
| Carboxyl group containing resin solution B-3 |  |  |  |  |  |  |  |  |
| Carboxyl group containing resin solution C-1 |  |  |  |  |  |  |  |  |
| Carboxyl group containing resin solution C-2 |  |  |  |  |  |  | 77 |  |
| Carboxyl group containing resin solution C-3 |  |  |  |  |  |  |  | 77 |
| Epoxy compound A | 45 | 45 | 45 | 45 | 45 | 45 | 45 | 45 |
| Epoxy compound B |  |  |  |  |  |  |  |  |
| Epoxy compound C |  |  |  |  |  |  |  |  |
| Photopolymerizable monomer |  |  |  |  |  |  |  |  |
| Photopolymerizable initiator A |  |  |  |  |  |  |  |  |
| Photopolymerizable initiator B |  |  |  |  |  |  |  |  |
| Filler A | 50 | 50 | 50 | 50 | 50 | 50 | 50 | 50 |
| Filler B | 100 | 100 | 100 | 100 | 100 | 100 | 100 | 100 |
| Filler C | 3 | 3 | 3 | 3 | 3 | 3 | 3 | 3 |
| Melamine resin | 4 | 4 | 4 | 4 | 4 | 4 | 4 | 4 |
| Defoamer | 3 | 3 | 3 | 3 | 3 | 3 | 3 | 3 |
| Colorant | 1 | 1 | 1 | 1 | 1 | 1 | 1 | 1 |
| Organic solvent | 14 | 14 | 14 | 14 | 14 | 14 | 14 | 14 |
| Acid resistance | A | A | A | A | A | A | A | A |
| Alkali resistance | A | A | A | A | A | A | A | A |
| Adhesiveness | A | A | A | A | A | A | A | A |
| Resistance to plating | A | B | A | A | B | A | A | A |
| Solder heat resistance | A | B | A | A | B | A | A | A |
| Pencil hardness | 6H | 5H | 6H | 6H | 5H | 7H | 7H | 6H |
| Electrical corrosion resistance | A | A | A | A | A | A | A | A |

TABLE 2-continued

|  | Examples | | | | Comparative Examples | | | |
| --- | --- | --- | --- | --- | --- | --- | --- | --- |
|  | 10 | 11 | 12 | 13 | 6 | 7 | 8 | 9 |
| Crack resistance | A | A | B | A | A | C | C | C |
| Bulge resistance | A | B | A | A | C | A | C | C |
| Protrusion resistance | A | A | A | A | A | A | C | C |

Note that details of the components on Tables will be described as follows.

*Epoxy compound A: Liquid bisphenol A epoxy resin (item number: EPICLON 850) available from DIC Corporation
*Epoxy compound B: Cresol novolac epoxy resin (item number: EPICLON N-695) available from DIC Corporation
*Epoxy compound C: Solid bisphenol A epoxy resin (item number: jER1001) available from Mitsubishi Chemical Corporation;
*Photopolymerizable monomer: dipentaerythritol hexaacrylate
*Photopolymerizable initiator A: 2-methyl-1-(4-methylthiophenyl)-2-molpholinopropane-1-one (item number: IRGACURE 907) available from CIBA JAPAN K.K.
*Photopolymerization initiator B: 2,4-diethylthioxanthone (item number: KAYACURE DETX-S) available from NIPPON KAYAKU CO., Ltd.
*Filler A: Crystalline silica powder with the average diameter of 2 μm (item number: Imushiru A-8) available from Tatsumori Ltd.
*Filler B: Barium sulfate (item number: BARIACE B30) available from SAKAI CHEMICAL INDUSTRY CO., LTD.
*Filler C: Silica fine powder with the average primary particle diameter of 16 nm (item number: AEROSILR 972) available from Nippon Aerosil Co., Ltd.
*Melamine resin: Melamine HM (item number) available from NISSAN CHEMICAL INDUSTRIES, LTD.
*Defoamer: Simethicone (mixture of dimethicone and silicic acid, item number: KS-66) available from Shin-Etsu Chemical Co., Ltd.
*Colorant: Phthalocyanine green
*Organic solvent: Diethylene glycol monoethyl ether acetate

The invention claimed is:

1. A resin composition for masks, comprising:
    first resin prepared by an addition reaction of polybasic acid anhydride with an adduct of an ethylenically unsaturated compound having a carboxyl group and bifunctional epoxy resin; and
    second resin prepared by an addition reaction of the monocarboxylic acid with one of epoxy groups of polyfunctional epoxy resin and an addition reaction of the polybasic acid with another of the epoxy groups,
    the ethylenically unsaturated compound containing ω-carboxy-polycaprolactone monoacrylate represented by the following general formula (1):

$$H_2C=CHCOO(C_5H_{10}COO)_NH \qquad (1)$$

wherein n is an integer of 1 or more, and
    the polyfunctional epoxy resin is novolac epoxy resin.

2. The resin composition for masks as set forth in claim 1, further comprising an epoxy compound containing at least two epoxy groups per molecule.

3. The resin composition for masks as set forth in claim 2, wherein
    the epoxy compound contains liquid bifunctional epoxy resin.

4. The resin composition for masks as set forth in claim 1, further comprising a photopolymerization initiator.

5. The resin composition for masks as set forth in claim 1, further comprising a photopolymerizable compound containing at least one selected from a group consisting of monomer and prepolymer both having photopolymerization properties.

6. The resin composition for masks as set forth in claim 1, wherein
    the ethylenically unsaturated compound further contains acrylic acid.

7. The resin composition for masks as set forth in claim 1, wherein
    the monocarboxylic acid contains monocarboxylic acid containing an ethylenically unsaturated group.

8. The resin composition for masks as set forth in claim 1, wherein
    an amount of the first resin is not more than an amount of the second resin.

* * * * *